US007231224B1

(12) United States Patent
Chesson

(10) Patent No.: US 7,231,224 B1
(45) Date of Patent: Jun. 12, 2007

(54) CABLE HAVING EMBEDDED ACCESS POINTS

(75) Inventor: Gregory Lawrence Chesson, Palo Alto, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 593 days.

(21) Appl. No.: 10/294,394

(22) Filed: Nov. 13, 2002

Related U.S. Application Data

(60) Provisional application No. 60/338,028, filed on Nov. 13, 2001.

(51) Int. Cl.
*H04B 7/00* (2006.01)
(52) U.S. Cl. ............... 455/523; 455/3.03; 455/446; 455/449; 340/310.01
(58) Field of Classification Search ............. 455/523, 455/3.03; 340/310.01, 310.02; 174/101.5, 174/10, 13, 24
See application file for complete search history.

(56) References Cited

U.S. PATENT DOCUMENTS

| 4,336,418 | A | * | 6/1982 | Hoag | 174/53 |
|---|---|---|---|---|---|
| 4,710,705 | A | * | 12/1987 | Kawabata | 324/102 |
| 5,230,080 | A | * | 7/1993 | Fabre et al. | 455/15 |
| 5,615,247 | A | * | 3/1997 | Mills | 455/411 |
| 5,809,429 | A | * | 9/1998 | Knop et al. | 455/523 |
| 6,140,911 | A | * | 10/2000 | Fisher et al. | 340/310.01 |
| 6,426,464 | B1 | * | 7/2002 | Spellman et al. | 174/101.5 |

* cited by examiner

*Primary Examiner*—Matthew Anderson
*Assistant Examiner*—Minh Dao
(74) *Attorney, Agent, or Firm*—Bever, Hoffman & Harms, LLP; Jeanette S. Harms

(57) ABSTRACT

A cable has miniaturized, low-cost, highly-integrated wireless network access points embedded in the cable at periodic intervals along the length of the cable. Power conductors that run the length of the cable supply each of the access points with electrical power. Each access point has an antenna for receiving and transmitting radio signals. The antenna of an access point is encapsulated, along with the rest of the access point circuitry, underneath an insulating protective outer sheath of the cable. The cable includes conductors that are usable for a purpose other than deploying a wireless network. When the cable is physically installed (for example, in the wall or ceiling of a building) for the other purpose, the access points are simultaneously physically installed. The access points so installed can then be activated and used as part of a wireless network.

27 Claims, 5 Drawing Sheets

CABLE HAVING EMBEDDED ACCESS POINTS

This application claims benefit of Ser. No. 60/338,028 filed on Nov. 13, 2001.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS REFERENCE TO RELATED APPLICATIONS AND CLAIM OF PRIORITY

This invention claims priority to the following co-pending U.S. provisional patent application, which is incorporated herein by reference, in its entirety:

Chessen, Provisional Application Ser. No. 60/338,028, entitled "CABLE INTEGRATED RADIO DEPLOYMENT SYSTEM," filed, Nov. 13, 2001.

BACKGROUND OF THE INVENTION

1. Field of Invention

A wireless network typically involves one or more wireless devices and one or more network-connected access points. When a wireless device comes within wireless communication range of an access point, a wireless communication link is established between the wireless device and the access point. The wireless device then communicates with and/or becomes part of the remainder of the network via the wireless communication link and the access point.

2. Discussion of Background

Promulgation of the IEEE 802.11 wireless local area network (WLAN) standard has contributed to the spread of wireless networking and an increase in corporate investment in wireless networking infrastructure. Access points and network cabling are now sometimes built into new office buildings as a matter of course because future wireless networking is expected within the building. In addition to the desire to provide wireless networking within buildings, there is an anticipated desire to extend wireless LAN connectivity to outdoor areas. Large areas of cities and corporate campuses may one day be covered with a grid of access points such that wireless LAN connectivity can be maintained as a wireless device moves across town or across campus.

At the same time that demand for wireless networking has been increasing, the size and per unit cost of access point circuitry has been decreasing. Over the last few years, access point circuitry has been integrated such that an access point can be realized with fewer and fewer components and integrated circuits. It is now envisioned circuit integration will progress to the point that the manufacturing cost of an access point will be a few dollars when purchased in volume. Despite the low per unit access point manufacturing cost, if access points and wireless networking are to become ubiquitous, the access points still need to be installed and wired together in buildings and in the out of doors. A solution that facilitates such ubiquitous installation of relatively inexpensive access points is desired.

SUMMARY OF THE INVENTION

A cable has miniaturized, low-cost, highly-integrated access points embedded in the cable at periodic intervals. Power conductors within the cable supply each of the access points with electrical power. Each access point is connected to an antenna for receiving and transmitting radio signals. In extremely high frequency (e.g., greater than 50 GHz), the antenna can be integrated into an integrated circuit device. The antenna of an access point is preferably encapsulated, along with the rest of the access point circuitry, underneath a protective outer sheath of the cable.

The cable may include conductors used for a purpose other than and in addition to deploying a wireless network. In one embodiment, the cable is a power cable. The power cable has power conductors running the length of the cable that are used for supplying power in a building, for example to supply power to lighting and/or wall plugs. In another embodiment, the cable is a network cable. The network cable has conductors running the length of the cable that are used for interconnecting parts of a wired computer network. The cable may be an Ethernet cable where the conductors are a twisted pair. In another embodiment, the cable is a telephone cable. The telephone cable includes telephone lines that run the length of the cable.

In each of these embodiments, the cable includes conductors provided for a purpose other than for deploying a wireless network. When the cable is then physically installed for this other purpose, the access points are simultaneously physically installed as well. Personnel installing the cable need not be particularly knowledgeable about wireless networks and may simply install the cable for the other purpose. After the cable has been installed, a person more knowledgeable about wireless networks can activate and enable various ones of the access points such that the access points become part of a wireless network.

In some embodiments, a central controller is coupled to one end of the cable. The central controller communicates in serial fashion with the access points via conductors in the cable. In this way, information to be transmitted from an access point passes from the central controller, to the access point, and is then broadcast through the access point antenna. Similarly, information received through an access point antenna is received by the access point and is sent down the cable in serial fashion to the central controller. The central controller may be a node on a hardwired computer network.

Although the multi-access point cable is described above as being installed for a purpose other than for deploying a wireless network, this need not be the case. A multi-access point cable can of course be installed for the primary purpose of deploying a wireless network.

This summary does not purport to define the invention. The claims, and not this summary, define the invention.

DESCRIPTION OF THE PREFERRED EMBODIMENTS

Figure 1:
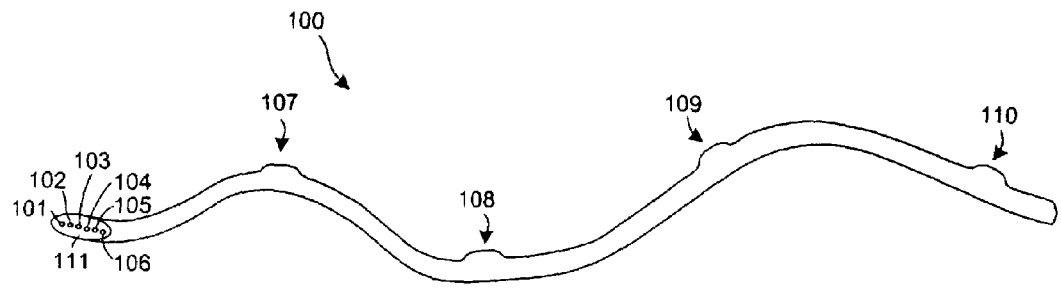
FIG. 1 is a diagram of a cable in accordance with an embodiment of the present invention.

FIG. 1 is a diagram of a section of a cable 100 in accordance with one embodiment of the present invention. Cable 100 includes a plurality of flexible conductors 101–106 and a plurality of access points 107–110. In this embodiment, the conductors 101–106 are wires. Access points 107–110 in FIG. 1 are represented as bulges in cable 100 because the access points 107–110 are preferably encapsulated along with the conductors by a protective outer sheath 111 of cable 100. The protective outer sheath is, for example, a non-RF electrically insulating material (e.g., does not shield RF, but does electrically insulate and protect access points, internal cables, or other parts from abrasion/weather).

Access points 107–110 are disposed at intervals. For example, one access point every six feet approximately along the length of cable 100. The cables could be manufactured with fixed AP-attach spacing, or variable, or custom and with indoor use or outdoor protection. The interval at which the access points are spaced may also vary considerably depending on certain design considerations, including, for example, (1) amount of cable to be placed at a site; (2) site construction techniques; (3) a communications range of the access points; (4) antenna interference considerations; and (5) a degree of redundancy desired.

Preferably, the circuitry of each access point is highly-integrated such that the unit cost of providing the access points in the cable is low. In some embodiments, each of access points 107–110 is capable of functioning as an access point in an IEEE 802.11 compliant wireless radio LAN (local area network).

One or more of the conductors of cable 100 is provided for and used for a purpose other than for deploying a wireless network. In the illustrated embodiment, conductors 105 and 106 are such conductors. Conductors 105 and 106 may be ordinary power conductors for supplying lights with electrical power or for supplying power to wall plugs. Conductors 105 and 106 may be a pair of conductors for carrying network information in a hardwired computer network. Conductors 105 and 106 may be telephone wires.

In accordance with one aspect of the invention, cable 100 is deployed for a purpose other than deploying a wireless network. In the example of conductors 105 and 106 being ordinary power conductors for powering lights and wall plugs, cable 100 is strung through the walls and/or ceiling of a building in the ordinary course of wiring the building. Once cable 100 is installed, conductors 105 and 106 are used to provide power lights and wall plugs. Because cable 100 also includes multiple access points 107–110, however, the wiring of the building with cable 100 results in the simultaneous installation of multiple access points 107–110 in the building. In the case where there is an access point for approximately every six feet of cable, many access points will typically be installed in the building.

Cable 100 may be installed by personnel not particularly familiar with wireless networks. Once the cable is installed, another person more knowledgeable about wireless networks can activate and enable various ones of the access points such that the access points form part of a wireless network.

Two of the conductors, in this case conductors 101 and 102, are power conductors. There may, for example, be a 3.3 volts DC potential between power conductors 101 and 102. These power conductors 101 and 102 run the length of cable 100 and are coupled to each of the access points 107–110. Other techniques, such as Power Over Ethernet (POE) may be utilized. However, DC power distribution is limited, particularly over longer distances. Preferably, power is distributed via low-voltage AC (e.g., 14 or 24 v, which may be installed in most locations without special permits).

Figure 2:
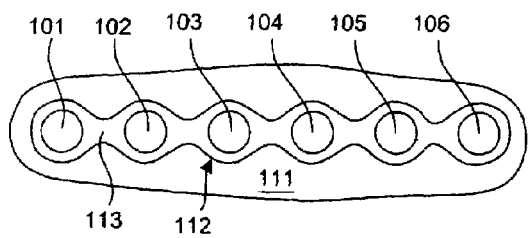
FIG. 2 is a cross-sectional diagram of the cable of FIG. 1 taken at a location where there is no access point.

FIG. 2 is a cross-sectional diagram of cable 100 at a location where there is no access point. Outer sheath 111 surrounds a ribbon cable 112. Ribbon cable 112 involves conductors 101–106 embedded within a supporting insulating plastic ribbon 113.

Figure 3:
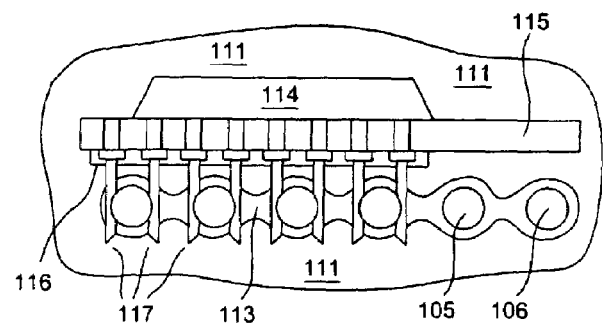
FIG. 3 is a cross-sectional diagram of the cable of FIG. 1 taken at the location of an access point.

FIG. 3 is a cross-sectional diagram of cable 100 at the location of access point 107. The circuitry of access point 107, as represented by the cross-sectional view of integrated circuit 114, is disposed on a printed circuit board 115. A connector 116 involving a plurality of downward pointing teeth 117 couples circuitry of the access point on the printed circuit board 115 to various ones of the conductors 101–104 in the ribbon cable 112 below.

Figure 4:
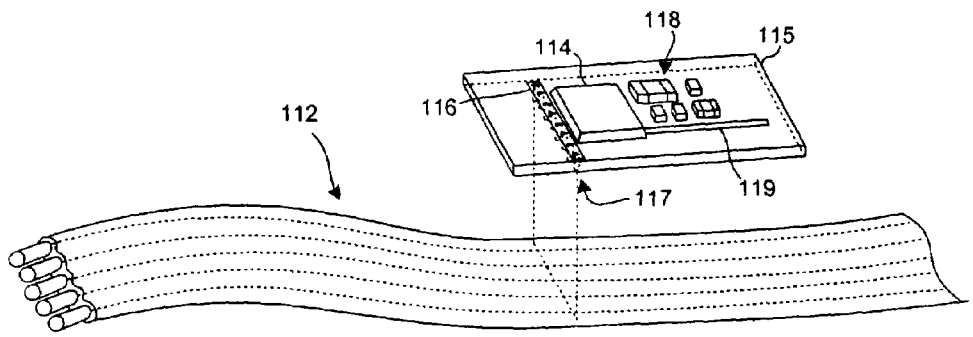
FIG. 4 is a perspective view showing how an access point is coupled to the remainder of the cable of FIG. 1.

FIG. 4 is an exploded perspective view that illustrates how access point circuitry on printed circuit board 115 is coupled to the conductors within ribbon cable 112. The teeth 117 on the bottom of printed circuit board 115 are pressed down into ribbon cable 112 such that the teeth 117 cut into the insulation 113 of the ribbon cable and make electrical contact with the conductors 101–104. Outer protective sheath 111 is not shown in FIG. 4 in order to better illustrate the mating of connector 116 and the ribbon cable 112.

All the circuitry of access point 107 but for a few discrete components, represented here as five components 118, are integrated in the form of one integrated circuit 114. Access point 107 transmits and receives radio waves via an antenna 119. Antenna 119 in this case is a trace on printed circuit board 115.

Although a connector having teeth that cut through insulation is illustrated here as the way that the circuitry of access point 107 is coupled to conductors within cable 100, there are numerous other ways this can be done. A connector need not be used. Teeth that cut through insulation need not be used. A separate printed circuit board for each access point need not be used. Cable 112 need not be a ribbon cable. The particular ribbon cable and connector embodiment of FIGS. 3 and 4 is illustrated to disclose but one way of accomplishing the coupling of access point circuitry to the cable. This example is not to be taken in a limiting sense.

Figure 5:
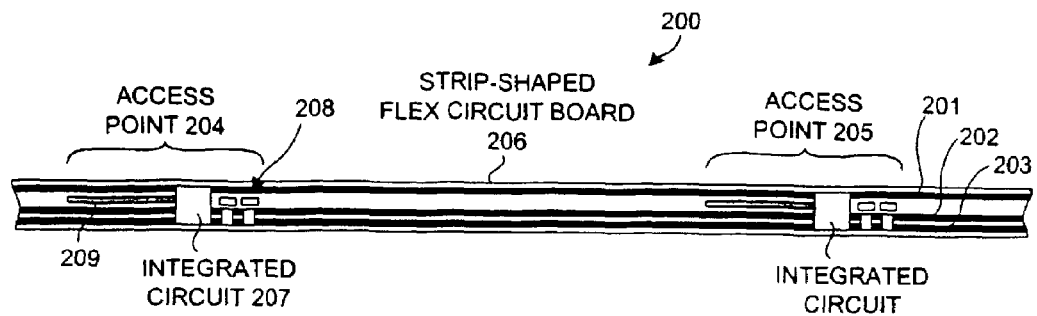
FIG. 5 is a top-down view of another embodiment of the present invention.

FIG. 5 is a top-down diagram of another embodiment in accordance with the invention. The embodiment of FIG. 5 involves no connector, no teeth, and no separate printed circuit board for each access point. Cable 200 involves a plurality of long strip-shaped conductors 201–203 and a plurality of access points 204 and 205. Strip-shaped conductors 201–203 are conductors on a strip-shaped flex circuit board 206. Although only three such conductors are illustrated in the diagram of FIG. 5, it is understood that flex circuit board 206 may involve additional conductors. In the embodiment of FIG. 5, the integrated circuits and other components of the access points are fixed directly to the flex circuit board 206. Access point 204 in FIG. 5, for example, involves a single integrated circuit 207 and a few discrete surface-mount components 208. The antenna of access point 207 for receiving and transmitting radio waves is realized in the form of a strip-like conductor 209 on the flex circuit board 206. The integrated circuits and other components of the embodiment of FIG. 5 are fixed to flex circuit board 206 by commonly employed automated soldering techniques. Once the circuitry of the access points is fixed to the flex-circuit board 206, the entire structure is encapsulated in an insulating and protective outer sheath (not shown) to form the resulting cable.

Once cable 100 has been installed, the access points communicate by sending and receiving information in serial fashion using conductors that extend to an end of the cable. In one embodiment, for example, an access point that receives a network communication via radio waves received on its antenna extracts the information carried by the radio waves and then sends that information via an Ethernet link to a central controller connected to one end of the cable. Both the access point and the central controller have Ethernet interface circuitry. The information is communicated from access point to central controller via two information conductors in the cable. These conductors may, for example, be a twisted pair. Not only does information flow from access point to central controller, but information also flows from the central controller to the access point. The central controller may, for example, send information to an access point so that the access point will transmit the information from its antenna. The Ethernet interface circuitry in the central controller sends the information in serial Ethernet fashion on the two information conductors and the Ethernet interface circuitry in the access point receives the information. The information is then transmitted from the antenna of the access point as radio waves.

Figures 6, 7:
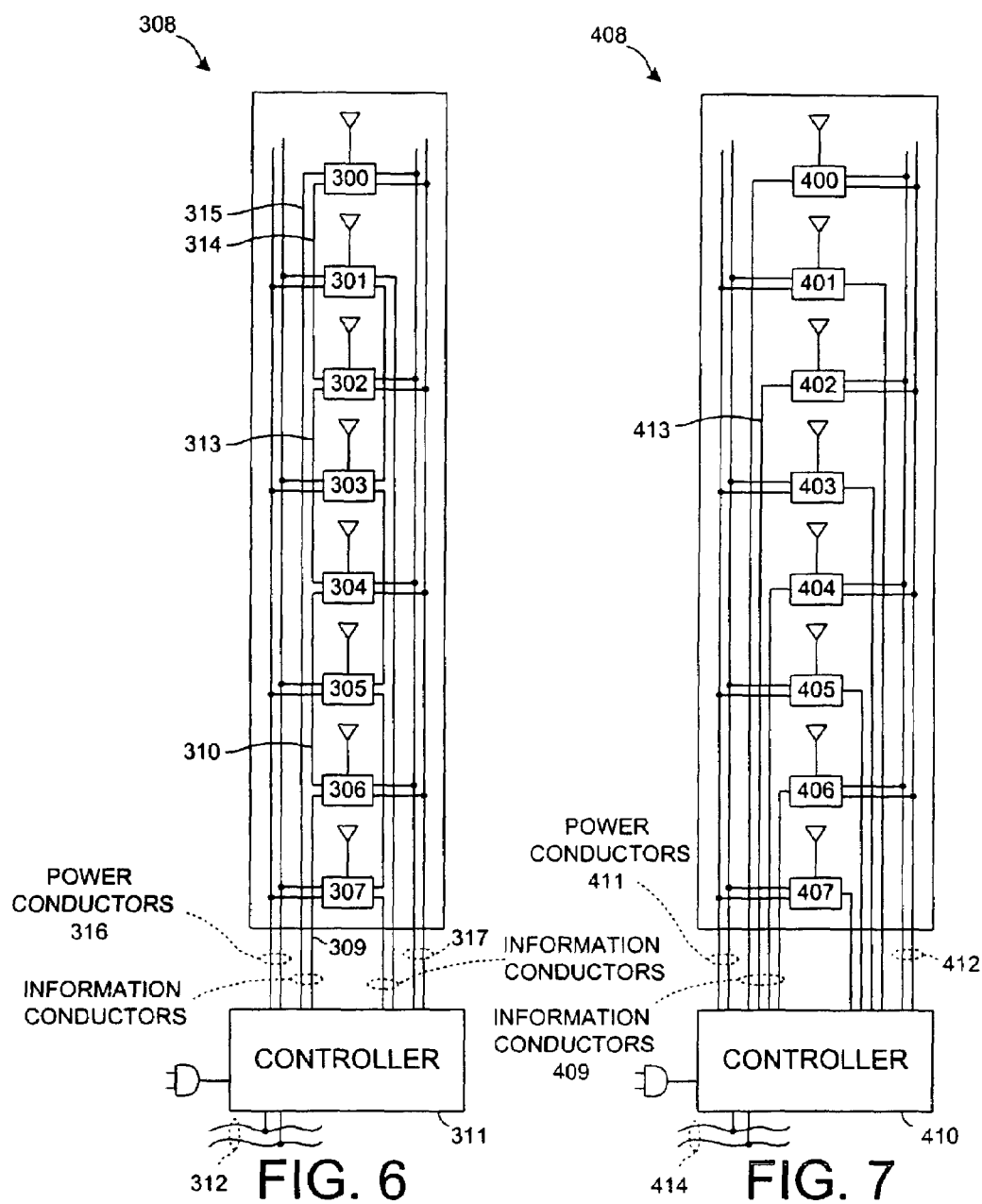
FIG. 6 is a simplified diagram of a ring configuration of access points and a central controller.
FIG. 7 is a simplified diagram of a star configuration of access points and a central controller.

FIG. 6 is a simplified schematic diagram of one such embodiment wherein the access points 300–307 of a cable 308 and a central controller 311 are connected in a ring configuration. Each access point receives information to be transmitted (from the access point antenna) via an information conductor and outputs information received (received on an access point antenna) by a different information conductor. Access point 306, for example, receives information via information conductor 309 and outputs information via information conductor 310. If, for example, information from network conductors 312 is to be transmitted from access point 302, then the information passes through controller 311, onto information conductor 309, through access point 306, onto information conductor 310, through access point 304, onto information conductor 313, and to access point 302. Access point 302 then transmits the information from its antenna. Access points 306 and 304 relay the information but do not transmit from their antennas. Similarly, if information received onto the antenna of access point 302 is to be communicated onto network conductors 312, then the information is passed through information conductor 314, through access point 300, onto information conductor 315, through controller 311, and onto network conductors 312.

Each of the access points 306, 304, 302 and 300 in this ring of FIG. 6 is powered by the same two power conductors 316 of cable 308. In the event of a failure in the ring comprising access points 306, 304, 302 and 300, another ring of access points 307, 305, 303 and 301 in cable 308 can be used. This second ring of access points is powered by its own pair of power conductors 317.

In addition to communicating information to be transmitted from an access point and in addition to communicating information that was received from an access point, the information conductors of FIG. 6 also communicate control information between the central controller 311 and the various access points. Central controller 311 can enable or disable any one of the access points remotely by sending appropriate control messages in serial fashion through the information conductors. In the event of a failure of an access point, a previously unused access point is enabled and used to perform the function of the failed access point. The failed access point is then remotely disabled. This ability to remotely enable and disable access points provides yet another measure of redundancy in addition to the provision of multiple access points in one ring.

FIG. 7 is a simplified schematic diagram of an embodiment wherein access points 400–407 of a cable 408 and a central controller 410 are connected in a star configuration. Each access point communicates with the central controller 410 via its own dedicated information conductor. If, for example, access point 402 receives network information on its antenna, access point 402 sends that information to central controller 410 via its dedicated information conductor 413. The information is passed through central controller 410 and is placed on network conductors 414. If information on network conductors 414 is to be transmitted in radio form by access point 402, then the information passes from network conductors 414, through central controller 410, through dedicated information conductor 413, and to access point 402. Access point 402 then transmits the information from its antenna.

There are two stars of access points in the star embodiment of FIG. 7. Each star of access points is powered by its own pair of power conductors. Power conductors 411 power the first star. Power conductors 412 power the second star. Individual ones of the access points of FIG. 7 can be independently enabled and disabled as desired via control messages sent from central controller 410 to the access points via the information conductors.

In the embodiments of FIGS. 6 and 7, an Ethernet protocol is used for communicating between the central controller and an access point and in the embodiment of FIG. 6 for communicating between a first access point and a second access point.

The controller in some embodiments includes an off-the-shelf IP router and a connector box. The connector box mates the IP router to the multi-access point cable. The connector box also receives power (for example, from an AC power plug) and supplies that power to the multi-access point cable. The IP router may, in some embodiments, be replaced with a bridge. Alternatively, the controller may be a specially designed box that directly mates both to the back-end infrastructure (for example, wide area network cable) as well as to the multi-access cable. Rather than a specially designed box, the controller may be a single-chip device that mates the multi-access point cable to the back-end infrastructure (for example, a single gigabit Ethernet cable. Such a controller may be installed in an equipment closet or similar convenient location where the controller can be coupled to an AC power source and to one or more connections to the back-end infrastructure. For large configurations (for example, involving one hundred multi-access point cables or more), a two-stage configuration may be used. In the two-stage configuration, a master controller is disposed in a central location (for example, a telecom closet). This master controller may, for example, be a standard IP router. A plurality of cable-controllers then interface the master controller to a plurality of multi-access point cables that extend out of the telecom closet. The plurality of cable controllers may be disposed in a single rack in the telecom closet. Alternatively, the plurality of cable controllers may be broken up into smaller groups wherein each group of cable controllers is deployed in a different remote location.

Figure 8:
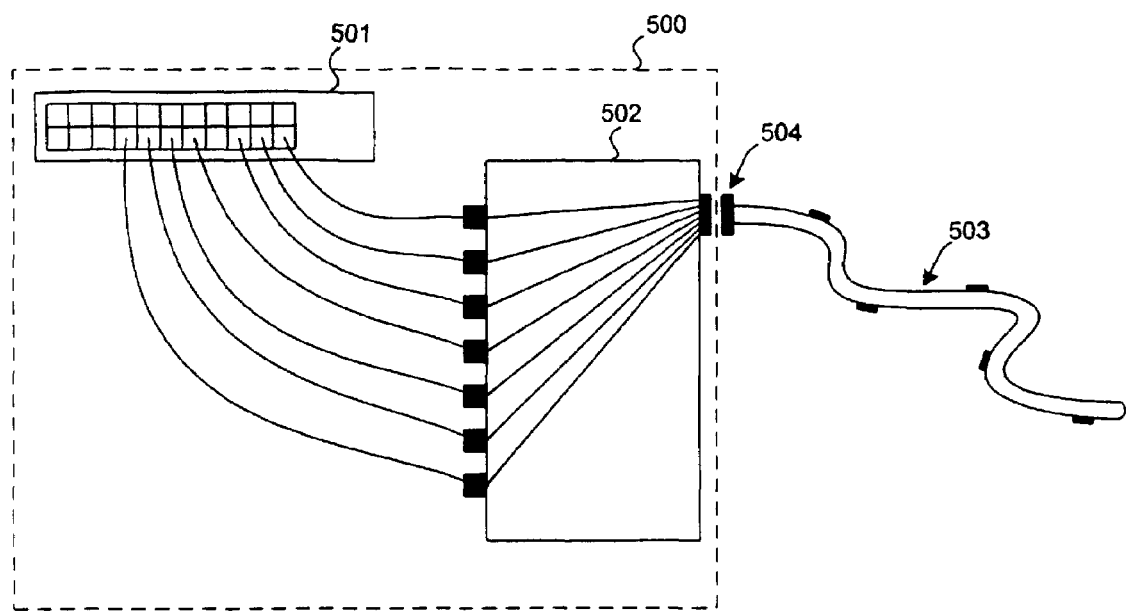
FIGS. 8–12 are diagrams of various embodiments of a controller in accordance with the present invention.

FIG. 8 is diagram of one embodiment of a controller 500. Controller 500 includes a commercial IP router 501 coupled to a cable connector box 502. The cable connector box 502 is coupled to multi-access point cable 503 via a connector 504.

Figure 9:
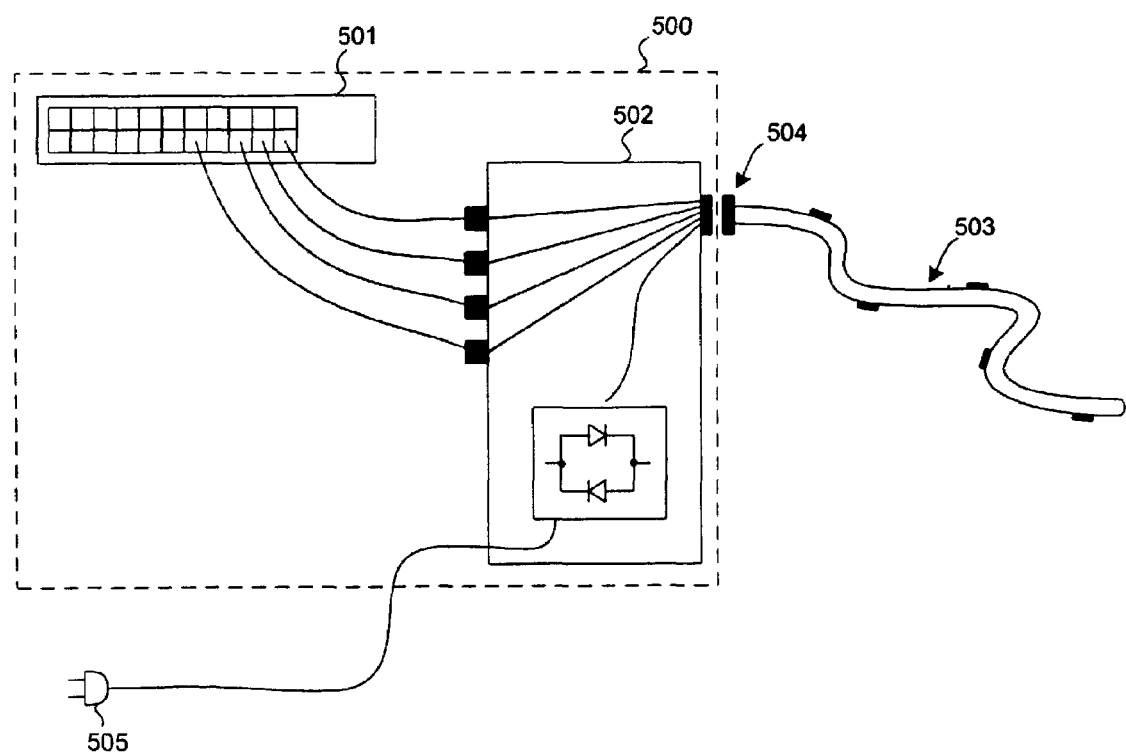

FIG. 9 is a diagram of another embodiment of controller 500. This embodiment is similar to the embodiment of FIG. 8, except that the controller is powered by AC power received via AC plug 505. A power supply 506 converts the AC power into DC power used by the controller.

Figure 10:
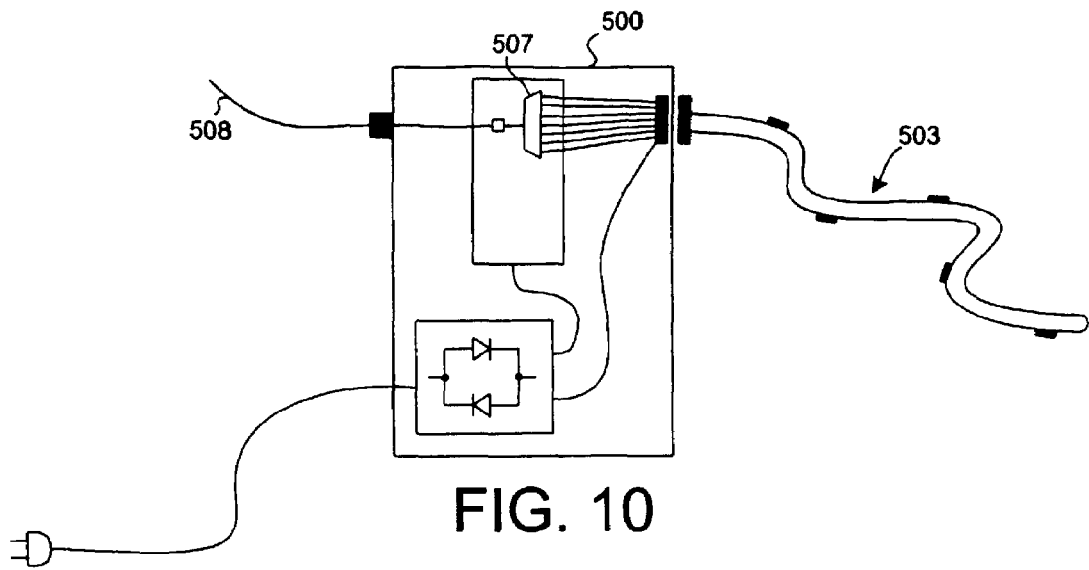

FIG. 10 is a diagram of another embodiment of controller 500. In this embodiment, a multiplexer 507 multiplexes communications between the multiple access points on cable 503 and a single back-end Ethernet cable 508 (for example, a gigabit Ethernet cable). The controller in this embodiment does not include a commercial IP router.

Figure 11:
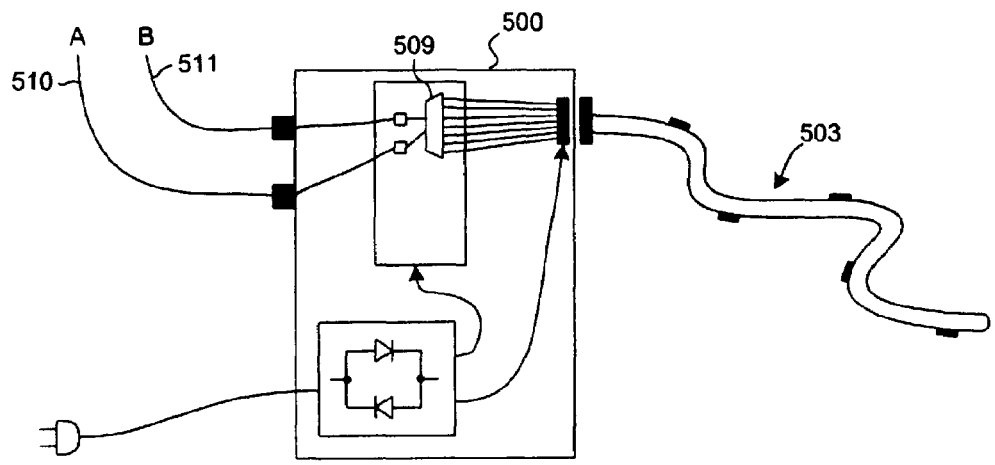

FIG. 11 is a diagram of another embodiment of controller 500. In this embodiment, a multiplexer 509 multiplexes communications between the multiple access points on cable 503 and one of two Ethernet cables 510 or 511 (either Ethernet cable A or Ethernet cable B).

Figure 12:
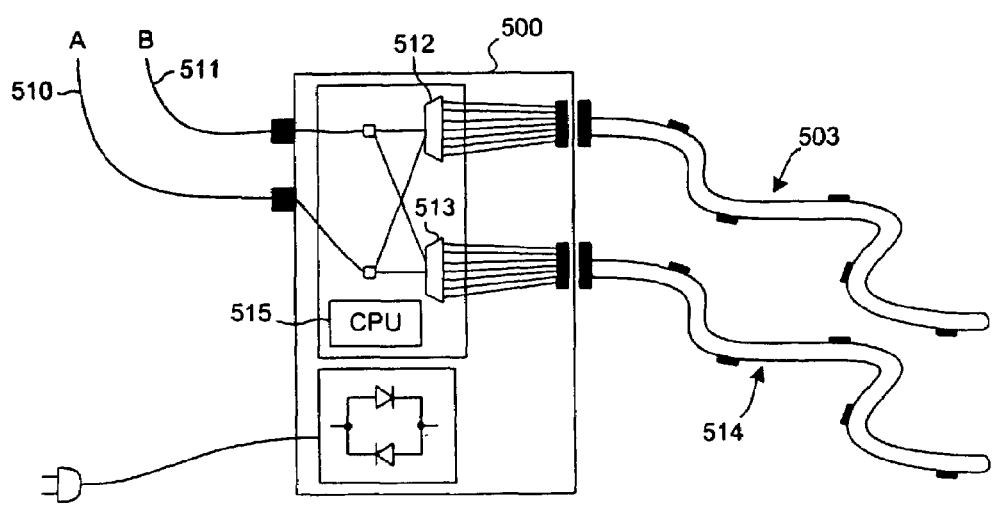

FIG. 12 is a diagram of another embodiment of controller 500. In this embodiment, multiplexers 512 and 513 multiplex communications between any access point (on either of two multi-access point cables 503 and 514) and either of two Ethernet cables 510 and 511 (either Ethernet cable A or Ethernet cable B). Multiplexers 512 and 513 are controlled by a processor 515 that is part of controller 500.

Any suitable method of providing the protective outer sheath (for example, sheath 111 of FIG. 1) may be employed. In one embodiment, heat-shrink tubing is preformed with a longitudinal slit that extends down the length of the tube. The cable assembly including the conductors and access points is slid into the heat-shrink tubing through the slit and the heat shrink tubing is then shrunk down around the assembly to form the finished cable. Heat shrink tubing without any slit may be slid over the conductor and access point assembly and the heat shrink tubing may then be shrunk down over the assembly. The protective sheath may a polymer that is formed at the interface of two liquids. The conductor and access point assembly may be passed through the interface of these two liquids such that when the polymer forms the polymer is drawn over the surface of the assembly. Alternatively, the conductor and access point assembly may be dipped into a viscous material or potting compound that later hardens or dries to form the sheath. Any suitable encapsulation technique used in the manufacture of electrical cables can be employed.

When conductors in the multi-access point cable include a twisted pair, the twisted pair may be flattened out at a point along the cable. An access point may then be attached to the flattened conductors at that point, for example via a mass termination connector that includes downward pointing teeth 117 (for example, see conductor 116 of FIG. 3). Where a ribbon cable is used, the ribbon cable can be rolled into a flexible tube and then unrolled and flattened at intervals where the access points are attached. In this way, access points may be placed at any desired location along with length of the ribbon cable. The ribbon cable may be folded so that the relatively wide mass termination connector (that couples the access point electronics to the ribbon cable conductors) is inline with the axis of the rolled portion of the ribbon cable. A strain relief member (for example, a plastic cord or a wire) may be disposed down the center of the rolled ribbon cable such that mechanical forces that would otherwise be borne by the ribbon cable and connector assembly are instead carried by the strain relief member. The mass termination connector may be of a clamp-on bracelet design that simultaneously clamps down over both the strain relief member and the ribbon conductor. In some embodiments, protective sheath 111 (see FIG. 3) is not provided over the access point printed circuit board 115. In such embodiments, an access point can be removed from the ribbon cable by unclamping its bracelett clamp-on connector from the ribbon cable, extracting teeth 117 from the ribbon cable, and removing the access point assembly from the ribbon cable. A replacement access point can then be attached to the ribbon cable by pushing the teeth 117 of its mass termination connector into the ribbon cable so that the teeth make electrical contact with the conductors within the ribbon cable. The bracelett clamp is then secured around the other side of the ribbon cable to hold the access point in place. In this way, individual access points may be replaced and/or upgraded in the field without having to remove and replace the entire cable.

Figure 13:
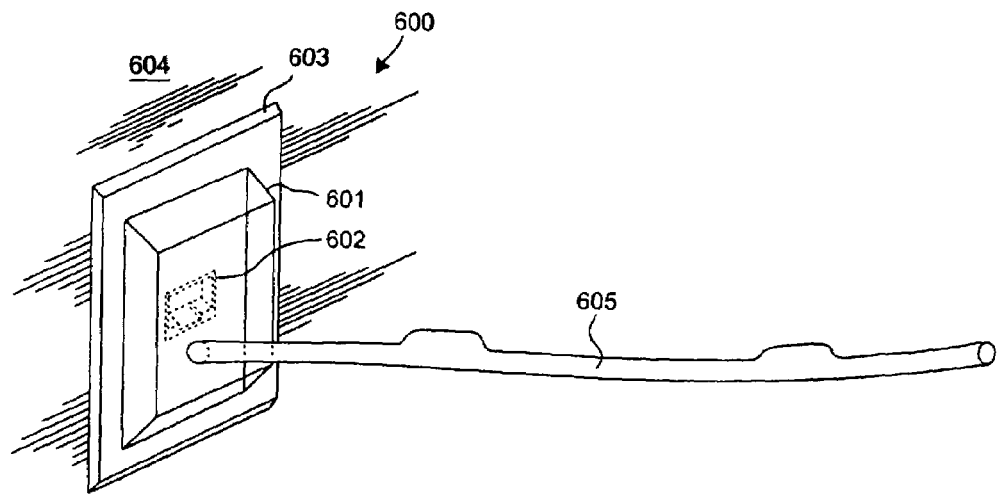
FIG. 13 is a perspective view of an embodiment 600 in accordance with the present invention wherein a multi-access point cable is powered only from power received via a network wall socket.

FIG. 13 is a diagram of an embodiment 600 similar to the embodiments of FIGS. 6 and 7, except that embodiment 600 involves no AC power plug. Rather, the controller 601 of embodiment 600 is powered by energy received from the network itself. Controller 601 plugs into an ordinary network socket 602 (for example, a network socket 602 in a faceplate 603 on a wall 604). Known POE (Power Over Ethernet) techniques may, for example, be employed such that controller 601 only receives power from socket 602. Controller 601 does not have a battery and is not battery-powered. Nor does controller have an AC wall plug through which it receives AC power. A multi-access point cable 605 extends from controller 601 at wall socket 602 to a location where an access point or access points are to be positioned. For example, cable 605 may be extend from wall faceplate 603 up to an office cubicle divider and across the top of the cubicle divider. Alternatively, cable 605 may extend from wall faceplate 603, to a bookshelf, and then up and across the top of the bookshelf. Alternatively, cable 605 may extend from wall faceplate 603 and then down and along a baseboard at the edge of the floor. Embodiment 600 is easily installed because only one physical connection (the connection of controller 601 to socket 602) is required. Although controller 601 is illustrated as being disposed between wall socket 602 and cable 605, this need not be the case. Controller 602 may be disposed along cable 605 at some distance from socket 602, an end of cable 605 being outfitted with a plug that plugs into socket 602. Controller 602 may be mated to the conductors in the cable in the same manner that access points are mated to the conductors in the cable.

Figure 14:
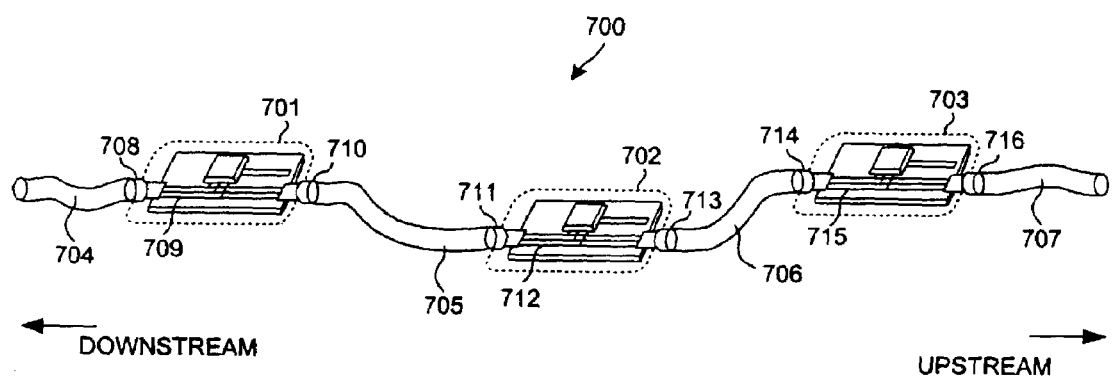
FIG. 14 is a diagram of a multi-access point cable in accordance with another embodiment of the present invention.

FIG. 14 is a diagram of a multi-access point cable 700 in accordance with another embodiment of the present invention. Multi-access point cable 700 includes a plurality of access points 701–703 that are coupled together in a series fashion by a plurality of individual sections 704–707 of cable. Each access point includes a printed circuit board, access point circuitry including an integrated circuit and an antenna, a first connector and a second connector. The first connector is used to couple the access point to a downstream cable section whereas the second connector is used to coupled the access point to an upstream cable section. Each individual cable section has a first connector and a second connector. The first connector is used to couple the cable section to the second connector of a downstream access point. The second connector is used to couple the cable section to the first connector of an upstream access point. Traces run across the printed circuit boards of the access points from the first connector to the second connector so that corresponding conductors in the downstream cable are coupled to corresponding conductors in the upstream cable. In this way, a power conductor extends through the length of the first section of cable 704, through the first connector 708 of access point 701, across a trace 709 on the printed circuit board of access point 701, through the second connector 710 of access point 701, through the second section of cable 705, through the first connector 711 of access point 702, across a trace 712 on the printed circuit board of access point 702, through the second connector 713 of access point 702, through the third section of cable 706, through the first connector 714 of access point 703, across a trace 715 on the printed circuit board of access point 703, through the second connector 716 of access point 703, and on up the multi-access point cable through fourth cable section 707. Some of the conductors of an access point extend from the first connector to the second conductor with the integrated circuit of the access point also being coupled to the conductor. Others of the conductors of the access point may, however, extend from the first connector to the integrated circuit and terminate there at the integrated circuit without extending to the second connector. Similarly, other conductors may extend from the integrated circuit to the second conductor without extending to the first conductor. Individual sections of the cable may, for example, be manufactured in volume complete with their first and second connectors by a cable manufacturing company that does not manufacture or distribute the access points. Although not illustrated in FIG. 14, one end of the multi-access point cable may terminate in a controller that couples the multi-access point cable to a back-end infrastructure. See the description of the controllers in FIGS. 6 and 7 for further details on such a controller. The first and second connectors of an access point are, in some embodiments, parts of a single three-way connector that can couple to two different cable ends as well as to a printed circuit board.

In one embodiment, the present invention is absent any physical informational conductors, and the physical information conductors (e.g., informational conductors 309 and 310) are replaced by wireless transmissions between the access points and at least one access point and the controller. In this embodiment, in addition to performing as an access point for a wireless network, at least one of the access points also performs functions needed to conduct information between the access points and the controller. Embodiments having various combinations of wired and wireless informational conductors are also envisioned.

Preferably, power conductors are utilized to provide power for operation of the access points. In one embodiment, plugs are provided at certain intervals along the cable so that a power source can be applied to the power conductors via the plugs. The power source may then be plugged into the cable at or near one or more of the Access Points (APs). For outdoor uses, the power source may be a solar unit (comprising a solar cell or other type of solar power source) with batteries that charge via the solar power source. The batteries are then utilized for power during period of no daylight.

In one embodiment, a series of power sources are plugged into the cable at predetermined distances on the cable, each power source being capable of providing power for a predetermined number of APs and length of cable (e.g., the number of APs intended to be activated and length of cable between power sources).

In one embodiment, the power unit includes its own wireless AP and a directional antenna that is specialized to backhaul the traffic from the APs on the cable wirelessly to some other place perhaps several kilometers distant (other distances may be utilized depending on the power unit's AP capabilities). Such an arrangement could be used so that a cluster of APs are available in one location (e.g., a public area) that is both solar powered and is beaming local traffic to a central site, or perhaps to another wireless setup. The cabling scheme provides a way to quickly deploy a high-density wireless nexus, and has the flexibility to be set up in any number of configurations or embodiments.

The plugs provided at certain points along the cable allow for injecting power into the cable at any location. The plugs, or other power connection mechanism, may be utilized in indoor as well as outdoor embodiments, and is convenient, particularly when the location of the power source is not certain or variable (e.g., provides multiple places where power can be applied). The power source may be a solar unit or power provided from a standard power outlet (any power source providing the appropriate voltage/current may be utilized).

In one embodiment, the controller (e.g., FIG. 6 and FIG. 7) is located in the middle (or other non-end location) of a cable, and the power function of the controller could be split from the "information conducting" function of the controller (i.e. two boxes (information conducting box and power box) rather than one box (combined power and information conducting)).

The present invention may be utilized in building construction, where a cable according to the present invention is placed as part of new construction. The cable may also be added to existing structures, or utilized in areas without construction. The use of the cables will dictate an amount of ruggedness required by a protective outer sheath of the cables (e.g. outdoor rated). The present invention may also be applied in harsh environments where extreme ruggedness may be required (e.g., hot/cold climates, saltwater, underwater, outer-space applications).

In describing preferred embodiments of the present invention illustrated in the drawings, specific terminology is employed for the sake of clarity. However, the present invention is not intended to be limited to the specific terminology so selected, and it is to be understood that each specific element includes all technical equivalents which operate in a similar manner. For example, when describing Ethernet interface circuitry for sending information on informational conductors, any other equivalent device capable of sending information on the conductors may be utilized.

Although the present invention is described above for instructional purposes in connection with certain specific embodiments, the present invention is not limited thereto. Various modifications, adaptations, and combinations of various features of the described specific embodiments can be practiced without departing from the scope of the invention as set forth in the claims.

What is claimed and desired to be secured by Letters Patent of the United States is:

1. A cable comprising:
a plurality of integrated circuits for implementing access points capable of being used in a wireless network, the access points connected to antennas for receiving and transmitting signals; and
a plurality of flexible conductors including a first set of flexible conductors to provide power to the plurality of integrated circuits and a second set of flexible conductors to facilitate deployment of the wireless network,
wherein the plurality of integrated circuits, the antennas, and the plurality of flexible conductors are disposed within the cable.

2. The cable of claim 1, further comprising a protective outer sheath, wherein:
the protective outer sheath is configured to encapsulate the plurality of integrated circuits, the antennas, and the plurality of flexible conductors; and
the plurality of integrated circuits are disposed at intervals along the cable.

3. The cable of claim 2, wherein the protective outer sheath is substantially tubular.

4. The cable of claim 1, further comprising:
a plurality of circuit boards, each integrated circuit coupled to a corresponding circuit board.

5. The cable of claim 4, wherein the antennas are formed in the plurality of circuit boards.

6. The cable of claim 1, wherein:
the plurality of flexible conductors include a plurality of flexible circuit boards;
each flexible circuit board includes an integrated circuit disposed thereon;
the flexible circuit board has a strip-shape that is elongated in a direction;
the plurality of flexible circuit boards are spaced from one another at intervals along the flexible conductors in the direction; and
the cable further includes a protective outer sheath that encapsulates the plurality of flexible circuit boards and the plurality of integrated circuits.

7. The cable of claim 1, wherein each access point is configured to use a corresponding antenna to facilitate two-way communication with a device not connected to the cable.

8. The cable of claim 1, wherein a first subset of the first set of flexible conductors is connected to a first subset of the access points, and a second subset of the first set of flexible conductors is connected to a second subset of the access points.

9. The cable of claim 1, wherein a first subset of the second set of flexible conductors is connected to a first subset of the access points, and a second subset of the second set of flexible conductors is connected to a second subset of the access points.

10. The cable of claim 9, wherein each of the second set of flexible conductors is a dedicated conductor for an access point.

11. The cable of claim 1, wherein the first set of flexible conductors and the second set of flexible conductors are symmetrically distributed about the access points in the cable.

12. The cable of claim 1, wherein each access point is configured to be remotely disabled and thereby removed from the wireless network.

13. The cable of claim 1, wherein:
the wireless network includes a controller;
the plurality of flexible conductors include a plurality of information conductors;
each of the information conductors is coupled between only one of the plurality of wireless access points and the controller; and
each access point is configured to receive information from and transmit information to the wireless network through the information conductor.

14. The cable of claim 1, wherein a plurality of access points are coupled together in a star configuration in which each access point communicates with a controller via a dedicated conductor.

15. The cable of claim 1, wherein a plurality of access points are coupled together in a ring configuration in which a controller at one end of the cable communicates with an access point at another end of the cable using a relay including multiple flexible conductors and multiple access points.

16. The cable of claim 1, wherein the cable is a multi-access point cable including a plurality of access points connected in series using the plurality of flexible conductors.

17. The cable of claim 1, wherein:
the plurality of flexible conductors comprises a first plurality of flexible conductors and a second plurality of flexible conductors;
a first group of the plurality of integrated circuits is disposed on a first printed circuit board;
a second group of the plurality of integrated circuits is disposed on a second printed circuit board;
a first connector and a second connector are coupled to the first printed circuit board;
a third connector and a fourth connector are coupled to the second printed circuit board;
the first plurality of flexible conductors are coupled to the first connector;
the second plurality of flexible conductors are coupled to the second connector and to the third connector;
the second group of integrated circuits are powered by a current that flows through at least one of the first plurality of flexible conductors, through the first connector, across the first printed circuit board and to the second connector, through the second connector, through at least one of the second plurality of flexible conductors, through the third connector, and to the second group of integrated circuits; and
the first plurality of integrated circuits are powered by a current that flows through the at least one of the first plurality of flexible conductors, through the first connector, and to the first group of integrated circuits.

18. A wireless network access point comprising:
access point circuitry;
a first connector adapted for coupling to a first cable;
a second connector adapted for coupling to a second cable; and
an electrical connection extending from a terminal on the first connector to a terminal on the second connector;
wherein the access point circuitry is coupled to the electrical connection such that the access point circuitry is powered by electrical energy received onto the wireless network access point via the terminal of the first connector, wherein:
the first connector further comprises a second terminal;
the wireless network access point further comprises an antenna; and the wireless network access point is configured to receive information on the antenna and output information in a serial fashion onto the second terminal of the first connector.

19. The wireless network access point of claim 18, further comprising:
a first and a second section of cable; and
a second and a third wireless network access point;
wherein:
the wireless network access point is coupled to the second wireless network access point via the first section of cable;
the first section of cable extending from the first connector of the wireless access device and to the second wireless network access point;
the wireless network access point is coupled to the third wireless network access point via the second section of cable; and
the second section of cable extending from the second connector of the wireless access device and to the third wireless network access point.

20. A method, comprising:
coupling a first access point to at least one of a plurality of flexible conductors such that the first access point can receive power from the flexible conductors; and
coupling a second access point to at least one of the plurality of flexible conductors such that the second access point can receive power from the flexible conductors;
wherein the first access point, the second access point, and the flexible conductors form a flexible cable; and
encapsulating the first access point, the second access point and the flexible conductors within a protective sheath, the protective sheath forming a part of the flexible cable.

21. A method of deploying a plurality of access points, comprising:
placing a cable in a building, the cable comprising:
a plurality of access points, each access point including an integrated circuit configurable to function in a wireless network;
a plurality of flexible conductors; and
a plurality of antennas,
wherein each access point has a corresponding antenna for communicating with the wireless network,
wherein each of the plurality of access points is coupled to a first set of the plurality of flexible conductors for power and to a second set of the plurality of flexible conductors for information transfer, and
wherein a third set of the plurality of flexible conductors function independently of the wireless network.

22. The method according to claim 21, further comprising the step of configuring at least one of the plurality of access points to be part of the wireless network.

23. The method according to claim 21, further comprising the step of using at least one of the plurality of access points as part of the wireless network.

24. The method of claim 21, further comprising the step of:
coupling the cable to a network connector.

25. The method according to claim 24, wherein:
the controller and the plurality of access points are configured to receive power only from the network connector;
the controller and the plurality of access points including no battery; and
the controller having no plug through which the controller receives AC power.

26. The method of claim 21, further comprising the step of:
coupling the cable to a controller.

27. The method according to claim 21, further comprising the step of:
setting up at least one of the access points as part of the wireless network via setup communications sent from a controller to the at least one of the access points.

* * * * *